United States Patent [19]

Ochii

[11] Patent Number: 4,566,081
[45] Date of Patent: Jan. 21, 1986

[54] SEMICONDUCTOR DEVICE WITH SPARE MEMORY CELLS

[75] Inventor: Kiyofumi Ochii, Yokohama, Japan

[73] Assignee: Tokyo Shibaura Denki Kabushiki Kaisha, Japan

[21] Appl. No.: 461,951

[22] Filed: Jan. 28, 1983

[30] Foreign Application Priority Data

Jan. 29, 1982 [JP] Japan .................................. 57-12781

[51] Int. Cl.[4] .............................................. G11C 7/00
[52] U.S. Cl. ....................................... 365/200; 371/10
[58] Field of Search ................. 365/200, 210; 371/10, 371/11

[56] References Cited

U.S. PATENT DOCUMENTS 4,422,161 12/1983 Kressel et al. ...................... 365/200

OTHER PUBLICATIONS

Vernon G. McKenny, "A 5 V 64K EPROM Utilizing Redundant Circuitry", ISSCC Digest of Technical Papers, pp. 146-147, Feb. 1980.

Primary Examiner—Joseph A. Popek
Attorney, Agent, or Firm—Finnegan, Henderson, Farabow, Garrett & Dunner

[57] ABSTRACT

A semiconductor memory device includes a plurality of bit memory sections, a plurality of column select circuits for selecting columns of each of the bit memory sections, and a spare memory section containing a column of spare memory cells. The first switching circuits are coupled with the column select circuits and a second switching circuit is coupled with the spare memory section. A control circuit responds to a specific address by turning off the selected one of the first switching circuits and turning on the second switching circuit.

14 Claims, 8 Drawing Figures

SEMICONDUCTOR DEVICE WITH SPARE MEMORY CELLS

BACKGROUND OF THE INVENTION

The present invention relates to a semiconductor device with spare memory cells.

With the increase in the memory capacity of recent semiconductor memory devices, there is an increasing probability that semiconductor memories will be fabricated containing defective memory cells, although the number may be very small. Technology has been studied and developed which enables the semiconductor memory devices containing defective memory cells to operate as if they didn't contain defective ones. The technology is based on the following idea. Spare memory cells, together with ordinary memory cells, are formed on a chip. When a defective memory cell is addressed, a spare memory cell is selected in place of the defective one using a spare memory cell select circuit having the address of the detective memory cell. The spare memory cell select circuit contains nonvolatile memory cells such as fusible elements for programming the address of the defective memory cell.

Figure 1:
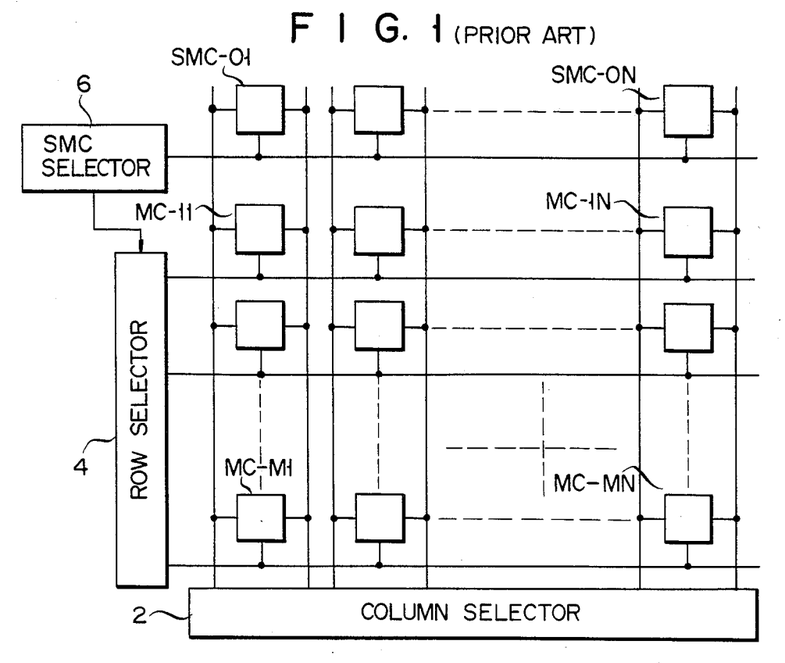
FIGS. 1 and 2 show arrangements of conventional semiconductor memory devices capable of compensating for defective memory cells by using spare memory cells.
Figure 2:
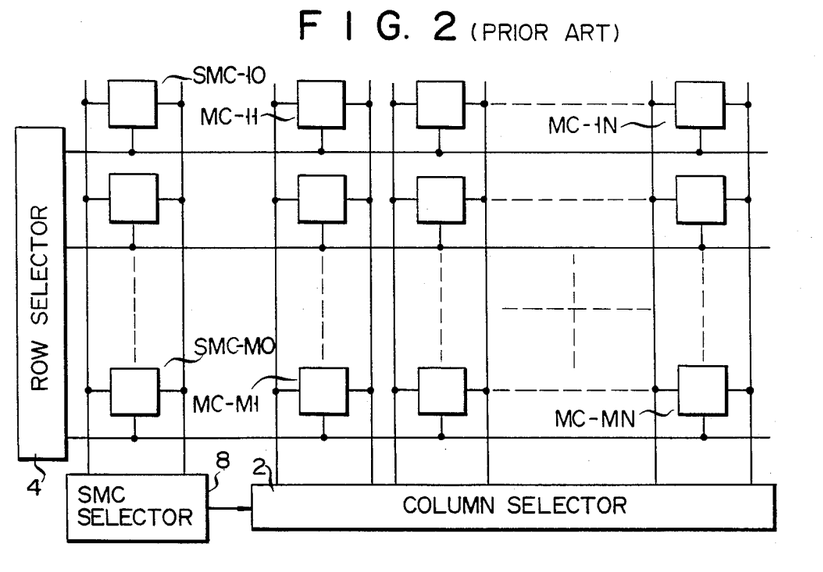

In this type of the memory device, spare memory cells are arranged together with a semiconductor memory having a plurality of memory cells (MC-11 to MC-MN) arranged in a matrix. Two ways of arranging the spare memory cells may be considered; the spare memory cells SMC-01 to SMC-ON are arranged on the same row, as shown in FIG. 1, or the spare memory cells SMC-10 to SMC-MO are arranged on the same column, as shown in FIG. 2. In the memory devices shown in FIGS. 1 and 2, the memory cells MC-11 to MC-MN are selected by a column select circuit 2 and a row select circuit 4 in a well known manner. The spare memory cells SMC-01 to SMC-ON shown in FIG. 1 are selected by a spare memory cell select circuit 6. The spare memory cells SMC-10 to SMC-MO shown in FIG. 2 are selected by a spare memory cell select circuit 8.

In the memory device of FIG. 1 or 2, if the memory cell MC-11, for example, is defective, the spare memory cells SMC-01 to SMC-ON or spare memory cells SMC-10 to SMC-MO are used in place of the memory cells MC-11 to MC-1N or memory cells MC-11 to MC-M1. More specifically, when the memory cell MC-11 is selected in the memory device of FIG. 1, the spare memory cell select circuit 6 responds to a control signal from an external control circuit (not shown) and supplies a row select signal to the spare memory cells SMC-01 to SMC-ON, while at the same time supplying an inhibit signal to the row select circuit 4. As a result, the row select signal from the row select circuit 4 is made ineffective. In the memory device shown in FIG. 2, the spare memory cell select circuit 8 receives a control signal from the external control circuit. Responding to the control signal, the select circuit 8 supplies a column select signal to the spare memory cells SMC-10 to SMC-MO and makes the select signal from the column select circuit 2 ineffective.

Figure 3:
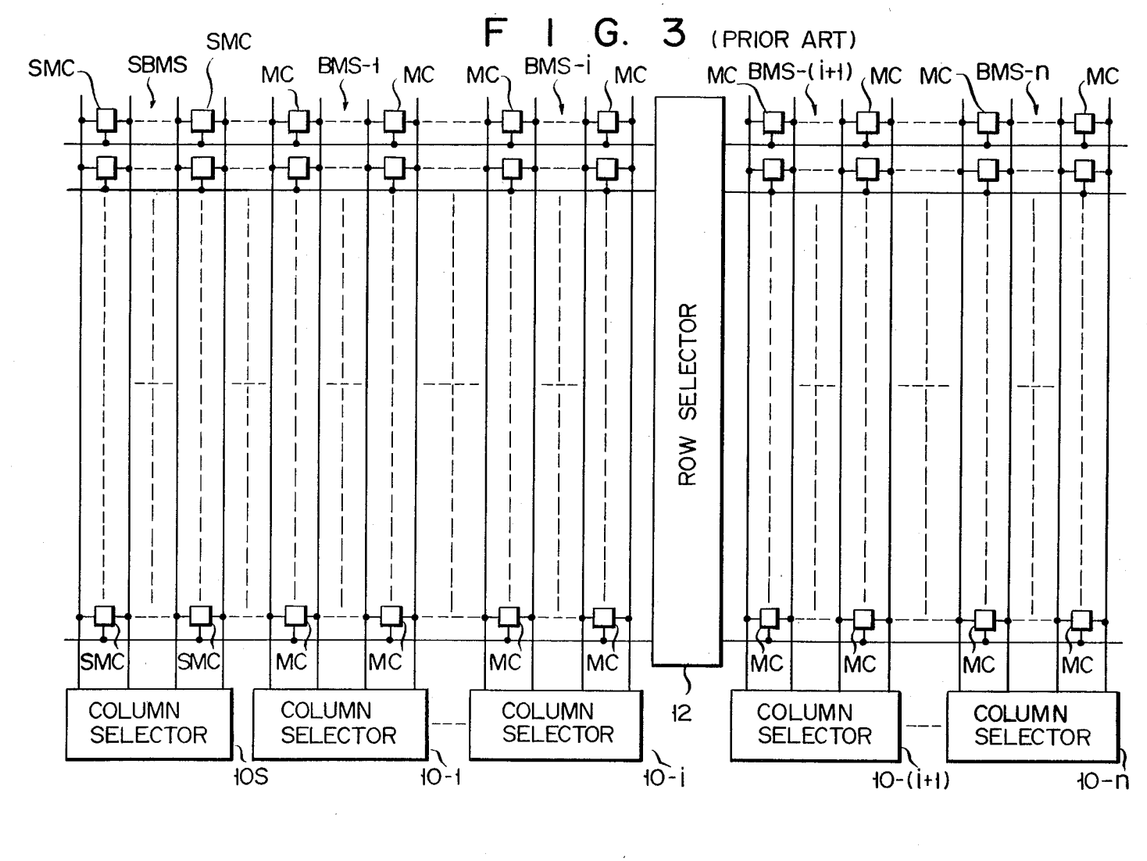
FIG. 3 shows an arrangement of a semiconductor memory device with a plurality of bit memory sections and one spare memory section.

An ordinary semiconductor memory device with which a plurality of bits are simultaneously read out and written is provided with a plurality of bit memory sections BMS-1 to BMS-i and BMS-(i+1) to BMS-n, as shown in FIG. 3. Each of the memory sections has an M×N array of memory cells MC. The bit memory sections BMS-1 to BMS-n are provided with column select circuits 10-1 to 10-n for selecting columns of the bit memory sections. A row select circuit 12 for selecting rows of the bit memory sections BMS-1 to BMS-n is connected between the bit memory sections BMS-i and BMS-(i+1). The semiconductor memory device shown in FIG. 3 is further provided with a spare memory section SBMS containing a spare M×N array of memory cells. The row memory cells of the spare memory section SBMS are selected by the row select circuit 12. The column memory cells in the spare memory section SBMS are selected by a column select circuit 10S.

Suppose now that, in the manufacturing stage of the semiconductor memory device, it is detected that one of the bit memory sections BMS-1 to BMS-n, for example, the bit memory section BMS-i includes at least one defective memory cell. In such a case, the column select circuit 10-i, for example, is substantially disconnected from a data line (not shown) to make the column select circuit 10-i ineffective in its column select function. At the same time, the column select circuit 10S is so designed as to have the same address as that of the column select circuit 10-i. Thus, the spare bit memory section SBMS is ready for use in place of the bit memory section BMS-i. With the provision of the bit memory section SBMS, even if defective memory cells are contained in the bit memory section BMS-i in the manufacturing stage, the semiconductor memory device may be operated as if it has no defective memory cells.

For designing the semiconductor memory device shown in FIG. 3 to have a memory capacity of 8 K words×8 bits=64 K bits, a great number of spare memory cells, about 8 K cells, are required. When two or more of the bit memory sections BMS-1 to BMS-n contain defective memory cells, the single spare bit-memory section is insufficient to compensate for the defective memory cells of the two or more bit-memory sections. Thus, even if a semiconductor memory device having spare memory cells of 8 K is fabricated, the semiconductor memory device is treated as a defective memory device when defective memory cells are contained in a plurality of bit memory sections, thereby providing a poor production yield.

SUMMARY OF THE INVENTION

Accordingly, an object of the present invention is to provide a semiconductor memory device which can effectively compensate for defective memory cells using a small number of spare memory cells.

According to the present invention, there is provided a semiconductor memory device comprising a plurality of bit memory sections each containing a plurality of memory cells arranged on a plurality of columns, column select switching circuits coupled with the bit memory sections, a plurality of first switching means coupled with the column select switching circuits, at least one spare memory section containing a plurality of spare memory cells arranged on a column, at least one second switching means coupled with the spare memory section and at least one control means programmable to turn off one of the first switching means and at the same time turn on the second switching means in response to a specified one of column select signals for selectively designating columns of each bit memory section.

According to the invention with such an arrangement, even if at least one of memory cells on the same column is defective, spare memory cells are used in place of these memory cells on the same row. Accordingly, a semiconductor memory device containing defective memory cells may be operated in a proper manner, and the defective portions of the semiconductor memory device may be compensated for using only a small number of spare memory cells.

DETAILED DESCRIPTION OF THE PREFERRED EMBODIMENTS

Figure 4:
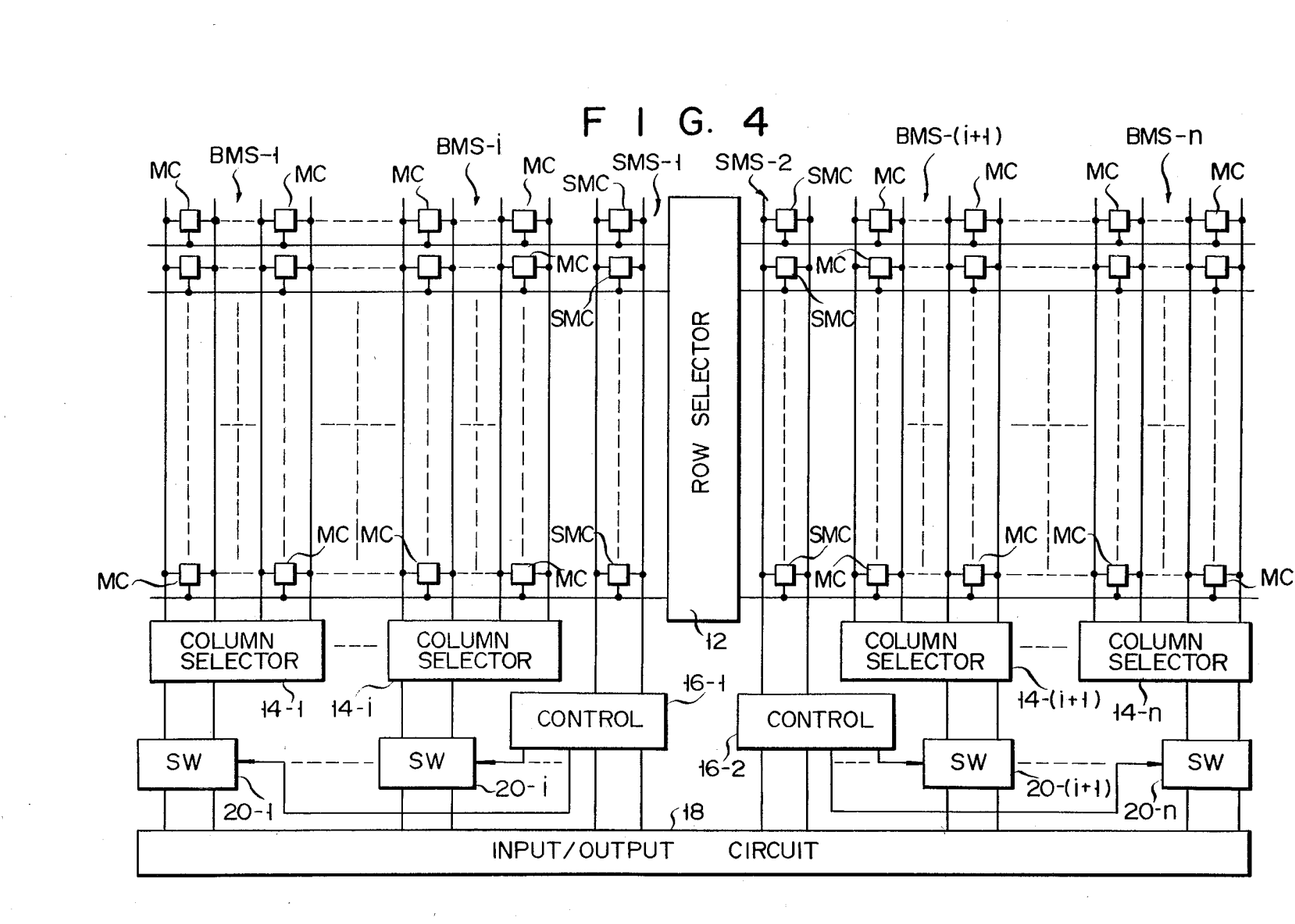
FIG. 4 shows an arrangement of a semiconductor memory device with a plurality of bit memory sections and two columns of spare memory cells according to an embodiment of the invention.

Referring to FIG. 4, there is shown an arrangement of a semiconductor memory device with spare memory cells according to an embodiment of the present invention. The semiconductor memory device, like that of FIG. 3, is provided with bit memory sections BMS-1 to BMS-i and BMS-(i+1) to BMS-n each having M×N array of memory cells MC, and a row select circuit 12 coupled between the bit memory sections BMS-i and BMS-(i+1) to commonly select rows in the bit memory sections BMS-1 to BMS-n. The bit memory sections BMS-1 to BMS-i and BMS-(i+1) to BMS-n are coupled with column select circuits 14-1 to 14-i and 14-(i+1) to 14-n, respectively. The semiconductor memory device is further provided with two spare memory sections SMS-1 and SMS-2 whose rows are selected by the row select circuit 12, and control circuits 16-1 and 16-2 (to be described later) respectively connected with the spare memory sections SMS-1 and SMS-2. The spare memory sections SMS-1 and SMS-2 each include M spare memory cells SMC arranged on the same column. The column select circuits 14-1 to 14-n are respectively connected to n pairs of data lines (not shown) of an input/output circuit 18 through respective switching circuits 20-1 to 20-n.

Figure 5:
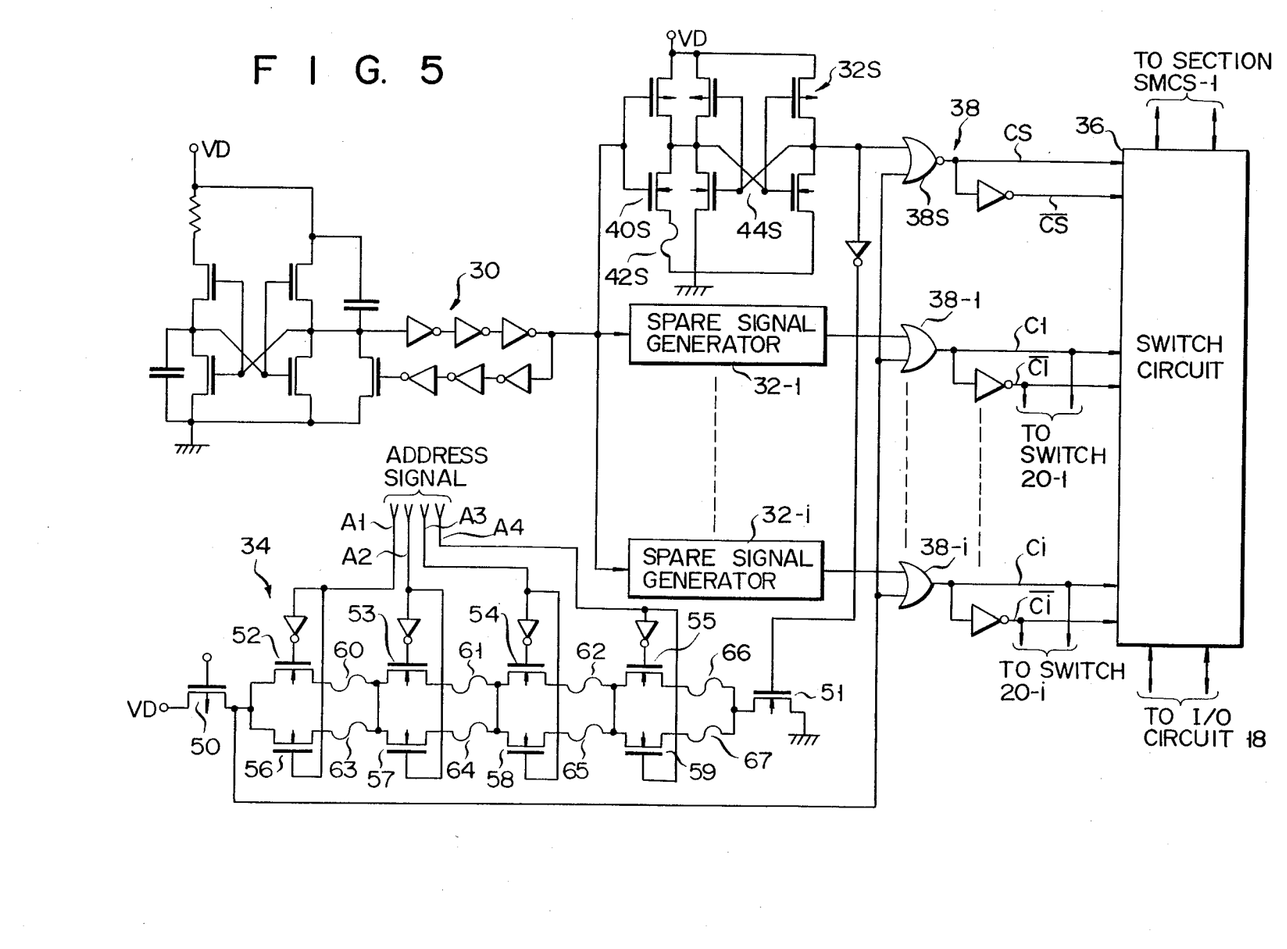
FIG. 5 shows a detailed arrangement of a control circuit shown in FIG. 4.

Turning now to FIG. 5, there is shown a detailed diagram of the control circuit 16-1 shown in FIG. 4. The arrangement and operation of the control circuit 16-2 is substantially the same as those of the control circuit 16-1. Hence no description of it will be given.

The control circuit 16-1 includes a power-on detector circuit 30 for generating a signal which is low in level immediately after the power is turned on and is high after a given time. Spare signal generating circuits 32S and 32-1 to 32-i generate a low or high level signal in response to an output signal from the power-on detector circuit 30. Address designating circuit 34 and a switching control circuit 38 generate switching control signals in response to the output signals from the spare signal generating circuits 32S and 32-1 to 32-i and the address designating circuit 34.

The spare signal generating circuits 32S and 32-1 to 32-i have the same circuit arrangements, respectively. The spare signal generating circuit 32S will be described as a typical example. The spare signal generating circuit 32S comprises a CMOS inverter 40s for inverting the output signal from the power-on detector circuit 30, a fuse element 42S coupled between one end of the current path of MOS transistors forming the CMOS inverter 40S and ground, and a flip-flop circuit 44S for generating an output signal with a level according to an output signal from the CMOS inverter 40S. The fuse elements of the spare signal generating circuits 32S and 32-1 to 32-i may be formed of a polycrystalline silicon layer, for example, and burned out when irradiated with a laser beam. The fuse element of one of the spare signal generating circuits 32-1 to 32-i corresponding to that one of the bit memory sections BMS-1 to BMS-i which contains a defective memory cell, is burned out. When a defective memory cell is contained in the bit memory section BMS-1, for example, the fuse element of the spare signal generating circuit 32-1 and the fuse element 42S of the spare signal generating circuit 32S are burned out.

The address designating circuit 34 comprises a MOS transistor 50 connected at the source to a power source terminal VD and operating as a load elements, a switching MOS transistor 51 grounded at the source and connected at the gate to the output terminal of the spare signal generating circuit 32S through an inverter, n-channel MOS transistors 52 and 55 whose current paths are connected in series between the MOS transistors 50 and 51, n-channel MOS transistors 56 to 59 whose current paths are connected in series between the MOS transistors 50 and 51, fuse elements 60 to 65 for respectively connecting the sources of the MOS transistors 52 to 54 and 56 to 58 to the drains of the MOS transistors 53 to 55 and 57 to 59, and fuse elements 66 and 67 for coupling the sources of the MOS transistors 55 and 59 to the drain of the MOS transistor 51.

The drains of the MOS transistors 52 to 55 are coupled with the drains of the MOS transistors 56 to 59, respectively. The gates of the MOS transistors 56 to 59 are applied with column address signals A1 to A4 used for selecting columns in the bit memory sections, via inverters. The column address signals A1 to A4 are directly supplied to the gates of the MOS transistors 56 to 59. The fuse elements 60 to 67 are selectively burned out so that the address designating circuit 34 forms an address designating circuit for designating a column containing a defective memory cell.

The switching control circuit 38 comprises a NOR gate 38S and OR gates 38-1 to 38-i whose first input terminals are respectively coupled with the spare signal generating circuits 32S and 32-1 to 32-i and whose second input terminals are connected to the output terminal of the address designating circuit 34. The output signals CS and C1 to Ci from the NOR gate 38S and OR gates 38-1 to 38-i are applied directly and through respective inverters to the switching circuit 36.

Figure 6:
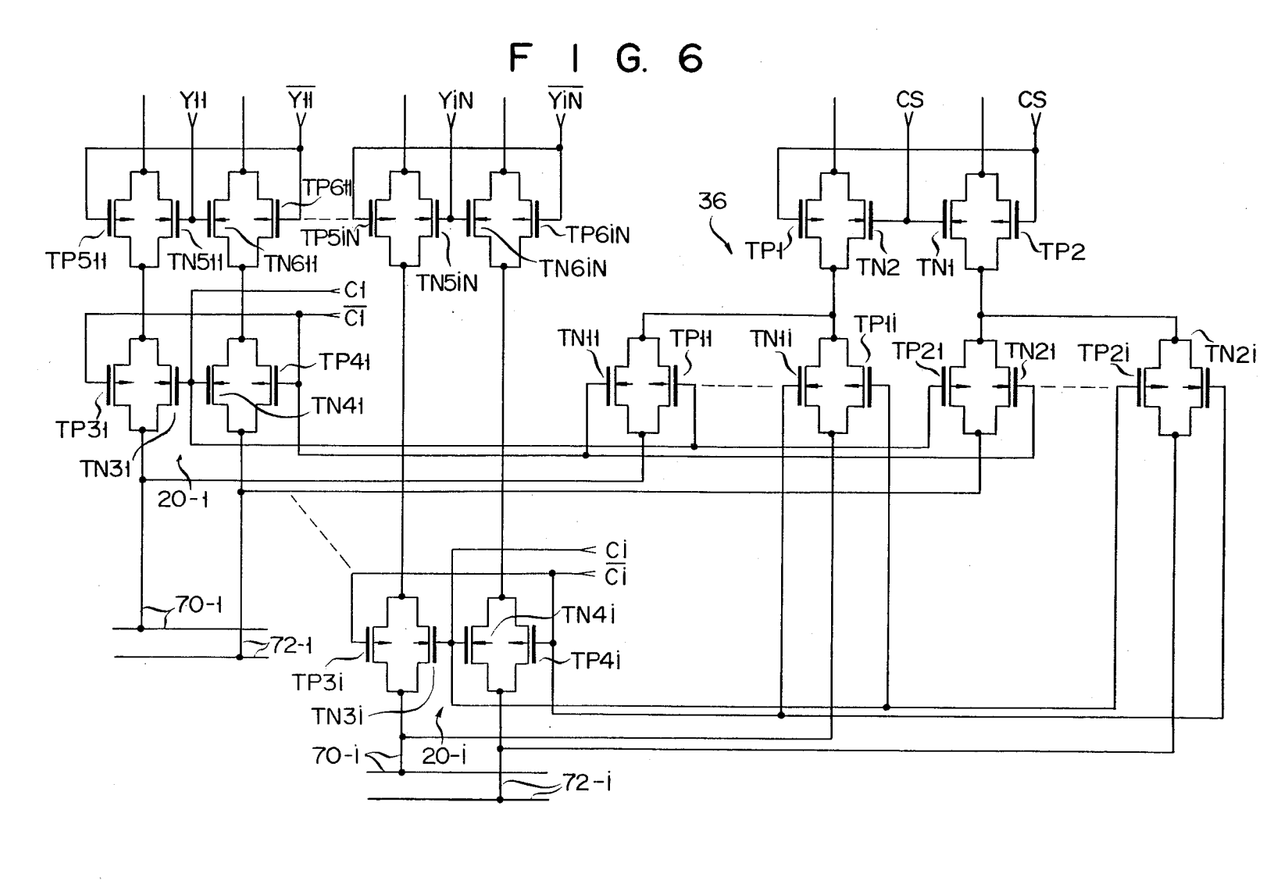
FIG. 6 shows a detailed arrangement of each of switching circuits shown in FIGS. 4 and 5.

The switching circuit 36, as shown in FIG. 6, comprises P-channel MOS transistors TP1, TP2, TP11 to TP1i and TP21 to TP2i, and N-channel MOS transistors TN1, TN2, TN11 to TNi and TN21 to TN2i. The MOS transistors TP1 and TN1 are coupled with a pair of bit lines of the spare memory cell section SMCS-1. The MOS transistors TN2 and TP2 are coupled in parallel with the MOS transistors TP1 and TN1, respectively. The current paths of the MOS transistors TN11 to TN1i are each connected at one end to one of the paired bit lines of the spare memory cell section SMCS-1 through the MOS transistors TP1 and TN2 and are connected at the other ends to data lines 70-1 to 70-i of the I/O circuit 18, respectively. The MOS transistors TP11 to TP1i are connected in parallel with the MOS transistors TN11 to TN1i, respectively. The current paths of the MOS transistors TP21 to TP2i are each connected at one end to the other of the paired bit lines of the spare memory cell section SMCS-1 through the MOS transistors TN1 and TP2 and are connected at the other ends to data lines 72-1 to 72-i of the I/O circuit 18, respectively. The MOS transistors TN21 to TN2i are coupled in parallel with the MOS transistors TP21 to TP2i, respectively.

The switching circuits 20-1 to 20-i shown in FIG. 4 are each comprised of two sets of parallel circuits of p- and n-channel MOS transistors. For example, the switching circuit 20-1 comprises p- and n-channel MOS transistors TP31 and TN31 whose current paths are connected in parallel to each other and which are each connected at one end to the data line 70-1, and p- and n-channel MOS transistors TP41 and TN41 whose current paths are connected in parallel to each other and which are each connected at one end to the data line 72-1. The switching circuit 20-i comprises p- and n-channel MOS transistors TP3i and TN3i whose current paths are connected in parallel to each other and which are each connected at one end to the data line 70-i, and p- and n-channel MOS transistors TP4i and TN4i whose current paths are connected in parallel with each other and which are each connected at one end to the data line 72-i.

The other ends of the current paths of the MOS transistors TP31 and TN31 are connected, through p- and n-channel MOS transistors TP511 and TN511 coupled in parallel with each other, to one of the paired bit lines of a corresponding one of N columns in the bit memory section BMS-1. The other ends of the MOS transistors TP41 and TN41 are coupled, through the p- and n-channel MOS transistors TP611 and TN611 coupled in parallel with each other, to the other of the paired bit lines in the same column. The other ends of the current paths of the MOS transistors TP3i and TN3i are connected, through the p- and n-channel MOS transistors TP5iN and TN5iN coupled in parallel with each other, to one of the paired bit lines of a corresponding one of N columns in the bit memory section BMS-i. The other ends of the current paths of the MOS transistors TP4i and TN4i are coupled, through the p- and n-channel MOS transistors TP6iN and TN6iN connected in parallel with each other, to the other of the paired bit lines in the same column of the bit memory section BMS-i.

The MOS transistors TP511, TN511, TP611 and TN611 constitute one of N decoding switches whose conduction states are controlled by decoding circuit (not shown) in the column select circuit 14-1. The MOS transistors TP5iN, TN5iN, TP6iN and TN6iN constitute one of N decoding switches whose conduction states are controlled by a decoding circuit (not shown) in the column selection circuit 14-i.

The gates of the MOS transistors TP11, TP21, TN31 and TN41 are connected to receive a control signal from the OR gate 38-1. The gates of the MOS transistors TN11, TN21, TP31 and TP41 are connected to receive a control signal C1. The gates of the MOS transistors TP1i, TP2i, TN3i and TN4i are connected to receive a control signal Ci from the NOR gate 38-i, and the gates of the MOS transistors TN1i, TN2i, TP3i and TP4i are connected to receive a control signal Ci. When all the switching circuits 20-1 to 20-i are in the ON state, the MOS transistors TP11 to TP1i, TP2l to TP2i, TN11 to TN1i and TN21 to TN2i are all kept nonconductive. When at least one of the switching circuits 20-1 to 20-i is in OFF-state, the corresponding ones of the MOS transistors TP11 to TP1i, TP21 to TP2i, TN11 to TN1i and TN21 to TN2i are rendered conductive and the MOS transistors TP1 and TP2 are coupled with one of the data lines 70-1 to 70-i and one of the data lines 72-1 to 72-i, respectively. The gates of the MOS transistors TN1 and TN2 are coupled to receive a control signal CS from the NOR gate 38S and the gates of the MOS transistors TP1 and TP2 are connected to receive a control signal CS.

The operation of the semiconductor memory device shown in FIGS. 4 to 6 will be described. Assume now that at least one defective memory cell is detected in memory cells on a first column of the bit memory section BMS-1. In this case, the fuse element 42S in the spare signal generating circuit 32S and the fuse element (not shown) in the spare signal generating circuit 32-1 are burned out and at the same time the fuse elements 63 to 65 and 67 in the address designating circuit 34 are burned out. As a result, the address designating circuit 34 has an address (0000) for designating the first column in the bit memory section.

Under this condition, when the power source is ON, the power-on detector circuit 30 generates a low level signal for a preset period of time. In response to the low level signal from the power-on detector circuit 30, the spare signal generating circuits 32S and 32-1 to 32-i produce low level signals. Then, when the output signal from the power-on detector circuit 30 goes high, the spare signal generating circuits other that the circuit 32-1 generate high level signals. Since the fuse element of the spare signal generating circuit 32-1 is burned out, the output terminal of the inverter (not shown) of the spare signal generating circuit 32-1 is in a floating state. Therefore, the output state of the flip-flop circuit (not shown) of the spare signal generating circuit 32-1 is kept unchanged, and the output signal from the spare signal generating circuit 32-1 is kept at a low level. The low output signal from the spare signal generating circuit 32S is applied, through the inverter, to the gate of switching MOS transistor 51 in the address designating circuit 34, thereby rendering the switching MOS transistor 51 conductive.

When the output signal of the address designating circuit 34 is high, the control signals C1 to Ci from the OR gates 38-1 to 38-i are high, and the MOS transistors TP11 to TP1i, TP21 to TP2i, TN11 to TN1i and TN21 to TN2i are all rendered nonconductive.

When a column address signal (0000) is applied to the address specifying circuit 34 and the circuit 34 generates a low level signal, the OR gate 38-1 produces a low level control signal C1. As a result, the MOS transistors TP31, TP41, TN31 and TN41 are rendered nonconductive and the MOS transistors TP11, TP21, TN11 and TN21 are rendered conductive. Also in this case, the NOR gate 38S generates a high level control signal CS and the MOS transistors TP1, TP2, TN1 and TN2 are rendered conductive. Accordingly, the spare memory section SMS-1 is actively coupled with the data lines 70-1 and 72-1. In this case, by the column select signal from the column decoder (not shown) of the column select circuit 14-1, the MOS transistors TP511, TP611, TN511 and TN611 are rendered conductive. At this time, however, the switching circuit 20-1 is kept turned OFF. Therefore, the bit memory section BMS-1 is separated from the data lines 70-1 and 72-1.

When no defective memory cell is contained in the bit memory sections BMS-1 to BMS-i, no fuse elements in the spare signal generating circuits 32S and 32-1 to 32-i and the address designating circuit 34 are burned out. Accordingly, in this case, the address designating circuit 34 generates a high level signal for any address signals, the NOR gate 38S produces a low level control signal CS, and the OR gates 38-1 to 38-i produce high level control signals C1 to Ci. Therefore, the MOS transistors TP1, TP2, TN1, TN2, TP11 to TP1i, TP21 to TP2i, TN11 to TN1i and TN21 to TN2i are all kept nonconductive, while the MOS transistors TP31 to TP3i, TP41 to TP4i, TN31 to TN3i and TN41 to TN4i are all kept conductive.

When at least one of the memory cells arranged on a column in the bit memory sections BMS-1 to BMS-i is defective, the fuse element 42S of the spare signal generating circuit 32S and, the fuse element of one of the spare signal generating circuits 32-1 to 32-i corresponding to one of the bit memory sections BMS-1 to BMS-i containing the defective memory cell, are burned out, and the fuse elements 61 to 67 of the address designating circuit 34 are selectively burned out to have an address that designates the column containing the defective memory cell. As a result, the defective memory cell and the memory cell on the column containing the defective memory cell may be replaced by the spare memory section SMS-1.

In the above description, a defective memory cell is contained in the bit memory sections BMS-1 to BMS-i. If the defective memory cell is contained in the bit memory sections BMS-(i+1) to BMS-n, the control circuit 16-2 operates like the control circuit 16-1. The spare memory sections SMS-2 is used in place of the defective memory cell and the memory cells arranged on the same column as that bearing the defective memory cell.

Figure 7:
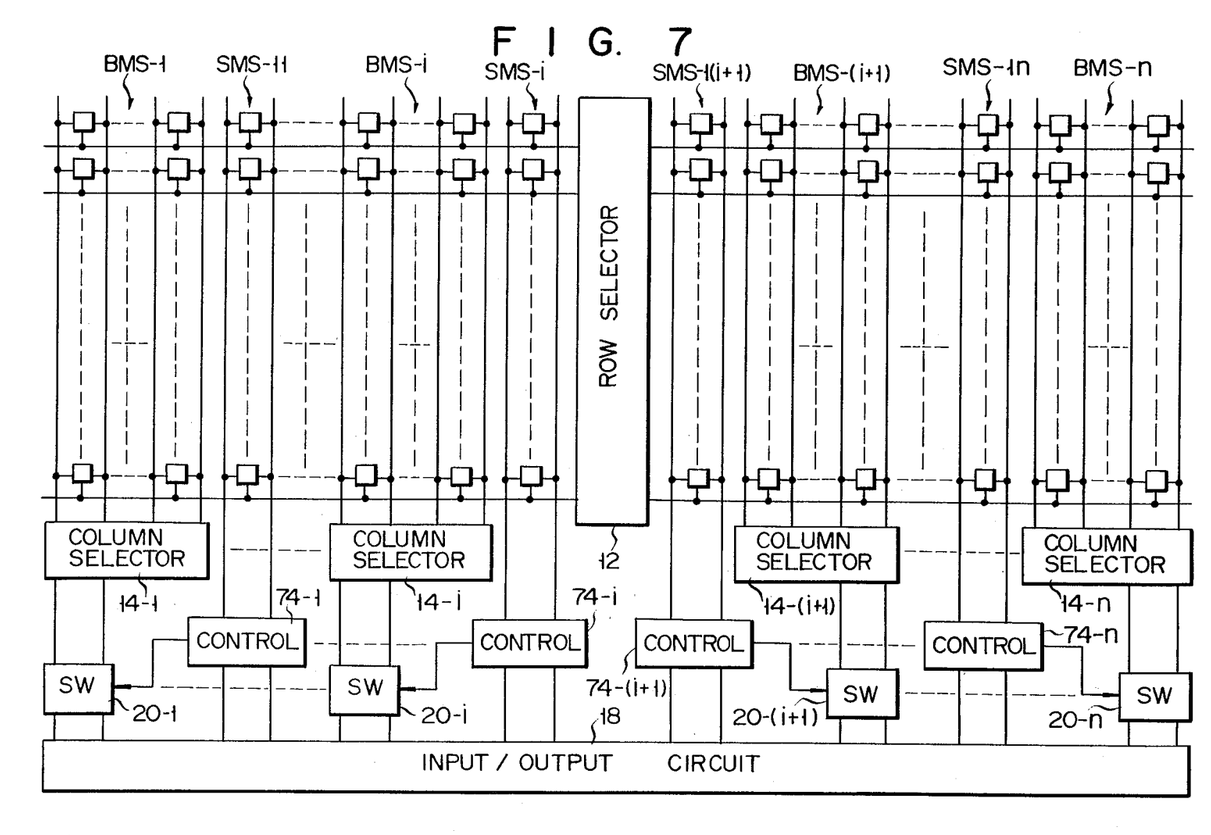
FIG. 7 shows an arrangement of a semiconductor memory device with a plurality of bit memory sections and spare memory sections of one column corresponding to the bit memory sections, which is another embodiment of the invention.

FIG. 7 shows a semiconductor memory device according to another embodiment of the present invention. The semiconductor memory device is the same as that of FIG. 4, except that spare memory sections SMS-11 to SMS-1n each having one column of memory cells are provided for the respective bit memory sections BMS-1 to BMS-n, and except that control circuits 74-1 to 74-n coupled with the spare memory sections SMS-1 to SMS-n are used in place of the control circuits 16-1 and 16-2. These control circuits 74-1 to 74-n have substantially the same construction. For example, the control circuit 74-1 comprises a power-on detector circuit 30, spare signal generating circuits 32S and 32-1, an address designating circuit 34, NOR gate 38S, OR gate 38-1, and a switching circuit 37. The spare signal generating circuits 32S and 32-1 are coupled with the output terminal of the power-on detector circuit 30. The logic gates 38S and 38-1 are connected at input terminals to the output terminal of the address designating circuit 34 and at the other input terminals to the output terminals of the spare signal generating circuits 32S and 32-1. The conduction state of the switching circuit 37 is controlled according to the output signals from the logic gates 38S and 38-1. The switching circuit 37 comprises, for example, the MOS transistors TP1, TP2, TN1 and TN2 and the MOS transistors TP11, TP21, TN11 and TN21 shown in FIG. 6.

Figure 8:
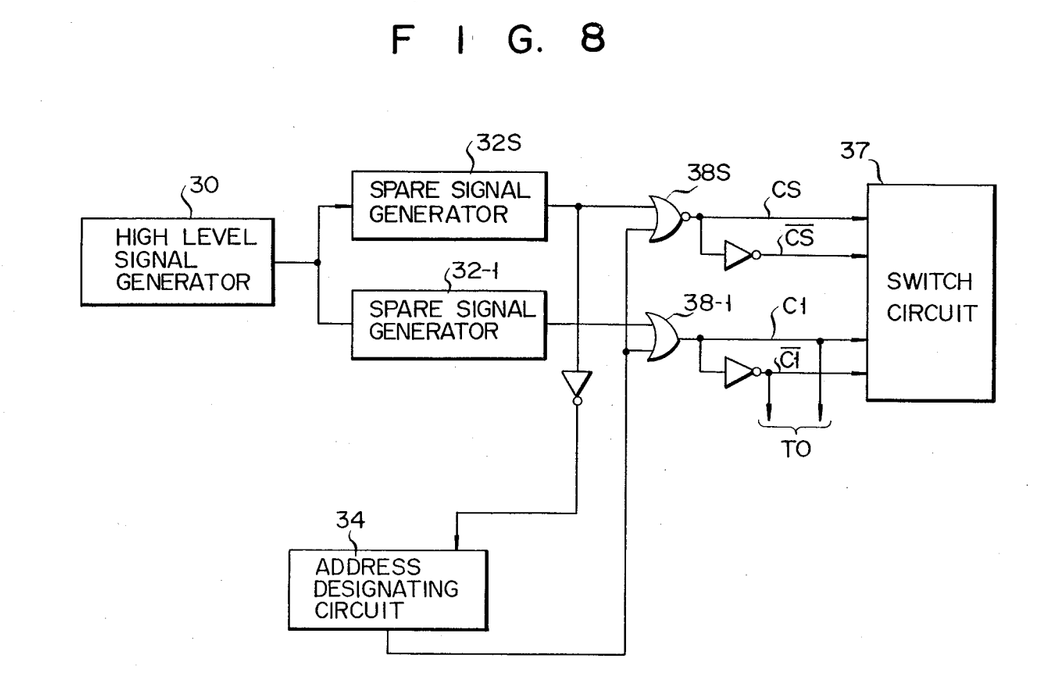
FIG. 8 shows a circuit diagram of a control circuit shown in FIG. 7.

Also in the embodiment of FIGS. 7 and 8, when the defective memory is contained on the first column of the bit memory sections BMS-1, for example, the fuse element 42S of the spare signal generating circuit 32S and the fuse element (not shown) of the spare signal generating circuit 32-1 are burned out, and the fuse elements (not shown) of the address designating circuit 34 are selectively burned out.

In the present embodiment, even if the defective memory cell is contained in one column of each of bit memory sections BMS-1 to BMS-n, the semiconductor memory device can be designed to operate normally.

While the invention has been described referring to preferred embodiments, the invention is not limited to those embodiments. In the above-mentioned embodiments, the control circuits 16-1, 16-2 and 74-1 to 74-n each have one power-on detector circuit 30. A single power-on detector circuit 30 may be provided for the control circuits 16-1 and 16-2, and a single power-on detector circuit 30 may be provided for the control circuits 74-1 to 74-n. The embodiment shown in FIG. 4 uses the spare memory sections SMS-1 and SMS-2 respectively provided for the bit memory sections BMS-1 to BMS-i and BMS-(i+1) to BMS-n. Alternatively, a plurality of spare memory sections are used for the bit memory sections BMS-1 to BMS-i and a plurality of spare memory sections for the bit memory sections BMS-(i+1) to BMS-n. In this case, a control circuit arranged like the control circuits 16-1 and 16-2 is required for each spare memory section.

In the embodiment shown in FIG. 7, a plurality of spare memory sections are provided for each bit memory sections BMS-1 to BMS-n. In this case, it is required to connect to each spare memory cell section a control circuit arranged like the control circuits 74-1 to 74-n.

Further, nonvolatile transistors such as NMOS transistors may be used as the nonvolatile memory elements used in the spare signal generating circuits 32S and 32-1 to 32-i and the address designating circuit 34, although fuse elements are used in the above embodiments.

In the embodiment shown in FIGS. 7 and 8, the spare signal generating circuit 32S and the NOR gate 38S may be omitted and the output terminal of the spare signal generating circuit 32-1 is coupled with the address designating circuit 34. In this case, the control signal C1 and C̄1 are applied as control signals CS and C̄S to the MOS transistors TN1, TN2, TP1 and TP2 gates. Further, it should be understood that the terms "row" and "column" can be used interchangeably.

What is claimed is:

1. A semiconductor memory device responsive to a plurality of column select signals comprising:
   a plurality of bit memory sections each including a plurality of memory cells arranged in a plurality of columns;
   a plurality of column select circuits coupled to said columns of memory cells in each of said bit memory sections for selecting said columns;
   a plurality of first switching means coupled to said column select circuits for selectively energizing said column select circuits;
   a spare memory section containing a column of spare memory cells;
   second switching means coupled to said spare memory section; and control means coupled to said first and second switching means for turning off one of said first switching means and for turning on said second switching means in response to one of said column select signals.

2. A semiconductor memory device according to claim 1, wherein said control means includes
   a plurality of logic circuits each having first and second input terminals and an output terminal, each said output terminal being connected to a corresponding one of said first switching means,
   a plurality of spare signal generating circuits for transmitting logic circuit control signals to the first input terminals of said logic circuits, and
   an address designating circuit for generating a specified address signal, said address designating circuit having an address designation output terminal coupled to said specified address signal and connected to the second input terminals of said logic circuits.

3. A semiconductor memory device according to claim 2, wherein said address designating circuit comprises resistive means and a plurality of parallel circuits serially connected to each other and to said resistive means, each of said parallel circuits having a pair of series circuits each formed of a switching element and a fuse element, said specified address signal being formed by said address designating circuit by selectively burning out said fuse elements, and wherein said control means also includes means for producing a control signal from said specified address signal to turn off one of said first switching means to turn on said second switching means.

4. A semiconductor memory device according to claim 3, wherein said control means includes means for producing a control signal when none of said fuse elements are burnt out to turn on all of said first switching means and turn off said second switching means.

5. A semiconductor memory device according to claim 2, wherein each of said spare signal generating circuits includes an inverter formed of CMOS transistors, a fusible element connected in series with a current path of said CMOS transistors, and a flip-flop circuit having a flip-flop input terminal connected to an output terminal of said inverter and a flip-flop output terminal connected to one of said logic circuits.

6. A semiconductor memory device according to claim 2, wherein said address designating circuit comprises resistive means and a plurality of parallel circuits serially connected to each other and to said resistive means, each of said parallel circuits including a pair of series circuits each formed of a switching element and a nonvolatile memory element, said specified address signal being formed in said address designating circuit by selectively rendering said nonvolatile memory elements nonconductive, and wherein said control means includes means for producing a first control signal upon receipt of said specified address signal to turn off one of said first switching means and turn on said second switching means.

7. A semiconductor memory device according to claim 6, wherein said control means includes means for producing a second control signal to turn off said second switching means when all of said nonvolatile memory elements are conductive.

8. A semiconductor memory device responsive to a plurality column select signals comprising:
   a plurality of bit memory sections each including a plurality of memory cells arranged in a plurality of columns;
   a plurality of column select circuits coupled to said columns of memory cells in said bit memory sections;
   a plurality of first switching means coupled to said column select circuits for selectively energizing said column select circuits;
   a plurality of spare memory sections each containing a column of spare memory cells, each corresponding respectively to one of said bit memory sections;
   a plurality of second switching means coupled to said spare memory sections; and
   a plurality of control means coupled to said first and second switching means for turning off one of said first switching means and for turning on one of said second switching means in response to one of said column select signals.

9. A semiconductor memory device according to claim 8, wherein each of said control means includes
   a logic circuit having first and second input terminals and an output terminal, said output terminal being connected to a corresponding one of said first switching means,
   a spare signal generating circuit for transmitting logic circuit control signals to the first input terminal of said logic circuit, and
   an address designating circuit for generating a specified address signal, said address designating circuit having an address designation output terminal coupled to said specified address signal and connected to said second input terminal of said logic circuit.

10. A semiconductor memory device according to claim 9, wherein said address designating circuit comprises resistive means and a plurality of parallel circuits serially connected to each other and to said resistive means and each of said parallel circuits having a pair of series circuits each formed of a switching element and a fuse element, said specified address being formed by said address designating circuit by selectively burning out said fuse elements, and whereby said control means includes means for producing a control signal from said specified address to turn off of said first switching means and turn on one of said second switching means.

11. A semiconductor memory device according to claim 10, wherein said plurality of control means each includes means for producing control signals to turn on all of said first switching means and turn off all of said second switching means when none of said fuse elements are burnt out.

12. A semiconductor memory device according to claim 9, wherein said signal generating circuit includes
   an inverter formed of CMOS transistors,
   a fusible element connected in series with a current path of said CMOS transistors, and
   a flip-flop circuit having a flip-flop input terminal connected to an output terminal of said inverter and a flip-flop output terminal connected to said logic circuit.

13. A semiconductor memory device according to claim 9, wherein said address designating circuit comprises resistive means and a plurality of parallel circuits serially connected to each other and to said resistive means, each of said parallel circuits having a pair of series circuits each formed of a switching element and a nonvolatile memory element said specified address signal being formed by said address designating circuit by selectively rendering said nonvolatile memory elements nonconductive, and wherein said control means includes means for producing a control signal upon receipt of said specified address to turn off one of said first switching means and turn on one of said second switching means.

14. A semiconductor memory device according to claim 13, wherein said plurality of control means each includes means for producing control signals, when all of said nonvolatile memory elements are conductive, to turn on all of said first switching means and turn off all of said second switching means.

* * * * *